United States Patent

[11] 3,619,797

[72] Inventor James W. Merrick
El Paso, Tex.
[21] Appl. No. 4,622
[22] Filed Jan. 21, 1970
[45] Patented Nov. 9, 1971
[73] Assignee Globe Universal Sciences, Inc.
El Paso, Tex.

[54] OPERATIONAL AMPLIFIER
1 Claim, 1 Drawing Fig.

[52] U.S. Cl. .......... 330/9, 330/24, 330/35, 330/20, 330/17
[51] Int. Cl. .......... H03f 1/02, H03f 3/16, H03f 3/04
[50] Field of Search .......... 330/151, 30 D, 69

[56] References Cited
UNITED STATES PATENTS

| | | | |
|---|---|---|---|
| 2,229.703 | 1/1941 | Larsen | 330/151 |
| 2,240,490 | 5/1941 | Caweil | 178/7.5 |
| 2,760,011 | 8/1956 | Berry | 330/151 X |

*Primary Examiner*—Nathan Kaufman
*Attorneys*—Arnold, White & Durkee, Tom Arnold, Pan Van Slyke, Frank S. Vaden, III and Robert A. White

ABSTRACT: A high-gain, broad bandwidth differential operational amplifier is described. High-frequency response is increased by means of a feed-forward path, which bypasses the cascaded low-frequency differential stages at high frequencies and feeds the signal directly to a common base cascade output stage so that the rolloff of the low-frequency cascaded stages does not affect the high-frequency response of the amplifier.

PATENTED NOV 9 1971 3,619,797
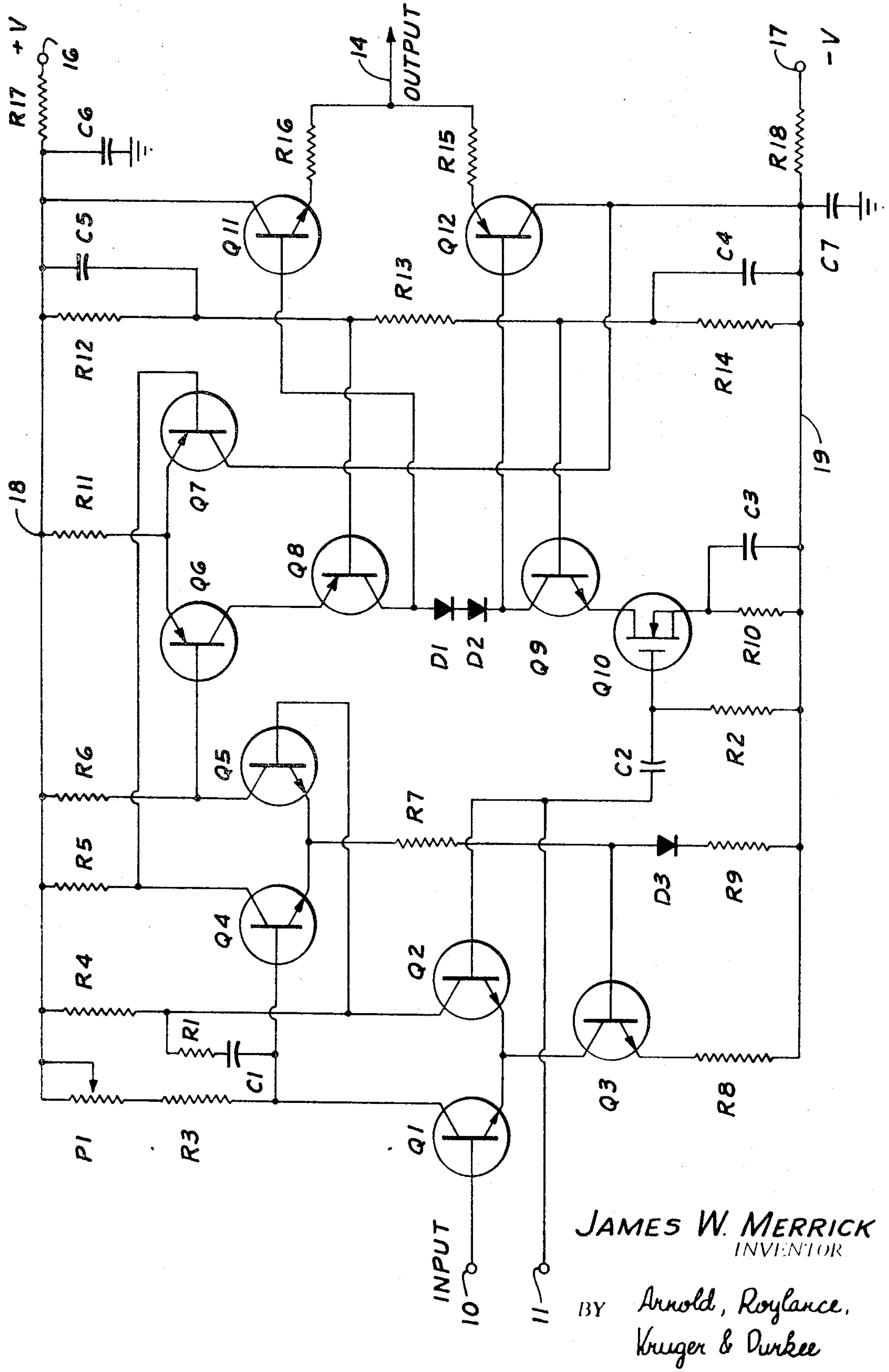
JAMES W. MERRICK
INVENTOR
BY Arnold, Roylance, Kruger & Durkee
ATTORNEYS

OPERATIONAL AMPLIFIER

BACKGROUND OF THE INVENTION

This invention relates to electronic amplifier circuits, and, more particularly, to a high-speed, high-gain operational amplifier having improved broadband frequency response.

Certain applications require operational amplifier circuits with high-speed, high-gain and broad bandwidth. For example, in digital data systems with the latest gain-ranging amplifiers having extremely broad bandwidths, high-gain and high-speed operational amplifiers are required. Extremely high stability and common-mode rejection ratio is also required in many applications for operational amplifiers.

SUMMARY OF THE INVENTION

The present invention provides an operational amplifier having improved gain and broad bandwidth. The amplifier comprises a number of low-frequency amplifier stages which are bypassed by a high-frequency feed-forward path. The high-frequency component of an input signal is routed through the feed-forward path to a high-frequency amplifier. The low-frequency amplifier stages can be designed for maximum gain and minimum rolloff in the low-frequency range. The high-frequency amplifier in the feed-forward path can be designed for maximum gain and optimum rolloff characteristics in the high-frequency range.

The high-frequency amplifier stage in the feed-forward path is preferably of the cascode type which has extremely high gain at high frequencies with a smooth rolloff, on the order of 6 db./octave, for stability. The use of circuit features in accordance with the present invention makes it possible to design operational amplifiers with a gain bandwidth of 250 to 400 megaHertz and a gain of approximately 160 db.

BRIEF DESCRIPTION OF THE DRAWING

The invention will now be described by way of example with reference to the accompanying drawing which is a schematic diagram of a circuit embodying the invention.

DETAILED DESCRIPTION OF THE DRAWING

Referring to the drawing, an operational amplifier is shown having a pair of differential input stages comprising respectively transistors Q1, Q2 and Q4, and Q5. A third transistor stage comprising transistors Q6, Q7 and Q8 is connected as a differential amplifier stage with a cascode output.

A feed-forward loop for high frequencies begins at input terminal 11 and passes through a high pass filter network comprising capacitor C2 and resistor R2. A high gain, cascode stage adapted for high-frequency response and comprising transistors Q9 and Q10 amplifies the output of the high-pass network and feeds it to a summation with the low-frequency component of the signal across diodes D1 and D2. A complementary emitter follower stage comprising transistors Q11 and Q12 is connected across diodes D1 and D2 to provide a single-ended output signal at the output terminal 14.

Power for the circuit as illustrated is provided from the positive and negative poles of a direct current source presented at terminals 16 and 17. The various stages of the amplifier are connected in balanced configuration across the voltage buses 18 and 19. Low-value resistors R17 and R18 link the voltage buses 18 and 19 to the power terminals 16 and 17.

The input terminals 10 and 11 to which a signal may be impressed are connected respectively to the bases of transistors Q1 and Q2 which form a pair of elements in a differential amplifier stage. The collector electrodes of transistors Q1 and Q2 are connected to the bases of the second stage comprising transistors Q4 and Q5. Negative feedback is provided between the first and second stages by way of a resistor R7 through a transistor Q3 to the common juncture of the emitters of transistors Q1 and Q2. Capacitor C2 and resistor R2 are selected to give the first stage an upper rolloff characteristic of less than 12 db. per octave. The output appearing at the collectors or transistors Q4 and Q5 is connected respectively to the bases of the third stage comprising transistors Q6 and Q7. The third stage is provided with a single-ended output through a cascode output stage comprising transistor Q8. Transistor Q8 has an extremely low input impedance and an extremely high output impedance. Transistor Q8 is connected in a common base configuration by virtue of its base being connected to a voltage divider network comprising resistors R12, R13 and R14. A pair of capacitors C5 and C4 bypass resistors R12 and R14 respectively to provide signal ground for alternating current signals passing through transistors Q8 and Q9.

The feed-forward path begins at the input terminal 11 and passes through the high-pass filter network comprising capacitor C2 and resistor R2. The high-frequency amplifier stage in the feed-forward path comprises an isolated gate, field-effect transistor Q10. Transistor Q10 has its gate electrode connected to the juncture between capacitor C2 and resistor R2, has its source electrode connected through a source resistor R10 to the voltage bus 19, and has its drain electrode connected to the emitter input of transistor Q9.

The output of transistor Q10 is fed through the emitter input of Q9 to the juncture of diodes D1 and D2. Transistor Q9 provides an extremely low input impedance and a high output impedance by virtue of its common base configuration. The low-frequency signals from the transistor Q8 are combined with the high-frequency signals from transistor Q9 across the diodes D1 and D2. The bases of transistors Q11 and Q12 are connected across diodes D1 and D2 to provide an output buffer stage. The emitters of transistors Q11 and Q12 are connected through emitter resistors R16 and R15 to a common output terminal 14. The signal appearing at output terminal 14 is a single-ended signal which is referenced to circuit ground potential.

By suitable choice of circuit component values and types the gain of the first stage comprising transistors Q1 and Q2 and the second stage comprising transistors Q4 and Q5 can be made as high as 60 db. The gain of the third stage comprising transistors Q6, Q7 and Q8 can be made as high as 100 db. to provide an overall gain of 160 db. The high-frequency stage comprising transistors Q9 and Q10 can also be arranged to have a gain of 100 db. to match the low-frequency gain upon summation across diodes D1 and D2. The low-frequency stages can be designed for maximum stability and response with a rolloff of 12 db. per octave, whereas the high-frequency stage comprising transistors Q9 and Q10 can be arranged to have a rolloff of 6 db. per octave. Hence, the overall amplifier combination can be designed to achieve a gain bandwidth of 400 megaHertz determined solely by the choice of components in the feed-forward path.

At low frequencies the amplifier illustrated in the drawing acts like a three-stage operational amplifier, but at very high frequencies it acts like a single stage ultrahigh frequency amplifier due to the feed-forward path which bypasses the first two differential amplifier stages with their phase shifts and time delays which would normally limit the maximum frequency response achievable in an operational amplifier while maintaining an adequate stability margin. The phase shift in the amplifier illustrated can be controlled for the high-frequency response in the signal merely by the single stage comprising transistors Q9 and Q10.

By virtue of the circuit features which are described above and embodied in the circuit illustrated in the drawing, an operational amplifier can be designed with higher speed, higher accuracy and broader bandwidth than previously known or used in the state of the art.

What is claimed is:

1. An operational amplifier circuit, comprising:

a plurality of differential amplifier stages connected in cascade with each other;

a feed-forward path connected to the input of said plurality of differential amplifier stages, said feed-forward path including a high-pass filter network;

a high-frequency amplifier stage connected in said feed-forward path to the output of said high-pass filter network, said highrfrequency amplifier stage comprising a field effect transistor connected in grounded source configuration;

a first output transistor connected to the output of said field effect transistor and being disposed in grounded base configuration;

a second output transistor connected to the output of the last of said differential amplifier stages, said second output transistor being disposed in grounded base configuration;

at least one diode connected between the collector of said first output transistor and the collector of said output transistor;

a complementary emitter follower stage connected across said diode, whereby a single-ended output signal may be derived from said complementary emitter follower circuit.

* * * * *